US006964895B2

(12) United States Patent
Hsu

(10) Patent No.: US 6,964,895 B2
(45) Date of Patent: Nov. 15, 2005

(54) METHOD OF FABRICATING VERTICAL ONE-TRANSISTOR FLOATING-BODY DRAM CELL IN BULK CMOS PROCESS WITH ELECTRICALLY ISOLATED CHARGE STORAGE REGION

(75) Inventor: Fu-Chieh Hsu, Saratoga, CA (US)

(73) Assignee: Monolithic System Technology, Inc., Sunnyvale, CA (US)

(*) Notice: Subject to any disclaimer, the term of this patent is extended or adjusted under 35 U.S.C. 154(b) by 0 days.

(21) Appl. No.: 10/705,112

(22) Filed: Nov. 10, 2003

(65) Prior Publication Data

US 2004/0104407 A1 Jun. 3, 2004

Related U.S. Application Data

(62) Division of application No. 10/095,984, filed on Mar. 11, 2002, now Pat. No. 6,686,624.

(51) Int. Cl.[7] .......................................... H01L 21/8242
(52) U.S. Cl. ...................... 438/238; 438/381; 438/268; 438/270
(58) Field of Search ................................ 438/268–274, 438/238–249, 381–392

(56) References Cited

U.S. PATENT DOCUMENTS

| | | | |
|---|---|---|---|
| 4,987,090 A | | 1/1991 | Hsu et al. |
| 5,216,269 A | | 6/1993 | Middelhoek et al. |
| 5,264,716 A | | 11/1993 | Kenney |
| 5,672,536 A | | 9/1997 | Wu et al. |
| 5,708,290 A | | 1/1998 | Cacciola et al. |
| 5,739,567 A | | 4/1998 | Wong |
| 5,789,286 A | | 8/1998 | Subbanna |
| 5,923,063 A | * | 7/1999 | Liu et al. .................... 257/316 |
| 5,937,296 A | | 8/1999 | Arnold |
| 6,281,557 B1 | | 8/2001 | Trueby et al. |
| 6,770,535 B2 | * | 8/2004 | Yamada et al. ............. 438/270 |

* cited by examiner

*Primary Examiner*—H. Jey Tsai
(74) *Attorney, Agent, or Firm*—Bever, Hoffman & Harms, LLP; E. Eric Hoffman

(57) ABSTRACT

A vertical one-transistor, floating-body DRAM cell is fabricated by forming an isolation region in a semiconductor substrate, thereby defining a semiconductor island in the substrate. A buried source region is formed in the substrate, wherein the top/bottom interfaces of the buried source region are located above/below the bottom of the isolation region, respectively. A recessed region is etched into the isolation region, thereby exposing sidewalls of the semiconductor island, which extend below the top interface of the buried source region. A gate dielectric is formed over the exposed sidewalls, and a gate electrode is formed in the recessed region, over the gate dielectric. A drain region is formed at the upper surface of the semiconductor island region, thereby forming a floating body region between the drain region and the buried source region. Dielectric spacers are formed adjacent to the gate electrode, thereby covering exposed edges of the gate dielectric.

13 Claims, 12 Drawing Sheets

METHOD OF FABRICATING VERTICAL ONE-TRANSISTOR FLOATING-BODY DRAM CELL IN BULK CMOS PROCESS WITH ELECTRICALLY ISOLATED CHARGE STORAGE REGION

RELATED APPLICATIONS

The present invention is a divisional of commonly owned U.S. patent application Ser. No. 10/095,984 filed Mar. 11, 2002, now U.S. Pat. No. 6,686,624, by Fu-Chieh Hsu, which is related to commonly owned, co-filed U.S. patent application Ser. No. 10/095,901, entitled "ONE-TRANSISTOR FLOATING-BODY DRAM CELL IN BULK CMOS PROCESS WITH ELECTRICALLY ISOLATED CHARGE STORAGE REGION" by Fu-Chieh Hsu.

BACKGROUND OF THE INVENTION

1. Field of the Invention

The present invention relates to a dynamic random access memory (DRAM) cell, as well as methods for operating and fabricating a DRAM cell. More specifically, the present invention relates to a vertical one-transistor floating-body DRAM cell formed using a process compatible with a bulk CMOS process, wherein charge is stored inside an electrically isolated body region adjacent to the transistor channel region.

2. Related Art

Conventional one-transistor, one-capacitor (1T/1C) DRAM cells require a complex process for fabrication. Moreover, significant area is required to form the capacitor needed for storage of signal charge. Recently, one-transistor, floating-body (1T/FB) DRAM cells using partially-depleted silicon-on-insulator (PD-SOI) processes have been proposed, in which a signal charge is stored inside a floating body region, which modulates the threshold voltage ($V_T$) of the transistor. As a result, the separate capacitor of a 1T/FB DRAM cell can be eliminated, thereby resulting in reduced cell area and higher density. Periodic refresh operations are still required for these 1T/FB DRAM cells to counteract the loss of stored charge through junction leakage, gate tunneling leakage and access-induced hot-carrier injections (HCI).

FIG. 1 is a cross-sectional view of a conventional 1T/FB DRAM cell 100 fabricated using a PD-SOI process. DRAM cell 100 includes silicon substrate 101, buried oxide layer 102, oxide regions 103–104, N++ type source and drain regions 105–106, N+ type source and drain regions 107–108, P type floating body region 109, gate oxide 110, gate electrode 111 and sidewall spacers 112–113. Floating body 109 is isolated by gate oxide 110, buried oxide layer 102 and the source and drain depletion regions 107' and 108'. The partially-depleted floating body 109 is used for storing signal charges that modulate the threshold voltage ($V_T$) of DRAM transistor 100 differently when storing different amount of charge. The source node 105 is typically grounded.

A logic "1" data bit is written into DRAM cell 100 by biasing drain node 106 at a high voltage and gate node 111 at a mid-level voltage to induce hot-carrier injection (HCI), whereby hot-holes are injected into floating body node 109, thereby raising the voltage level of floating body node 109, and lowering the threshold voltage ($V_T$) of cell 100. Conversely, a logic "0" data bit is written into DRAM cell 100 by biasing drain node 106 to a negative voltage while gate node 111 is biased at a mid-level voltage, thereby forward biasing the floating body-to-drain junction and removing holes from floating body 109, thereby raising the threshold voltage ($V_T$) of cell 100.

A read operation is performed by applying mid-level voltages to both drain node 106 and gate node 111 (while source node 105 remains grounded). Under these conditions, a relatively large drain-to-source current will flow if DRAM cell 100 stores a logic "1" data bit, and a relatively small drain-to source current will flow if DRAM cell 100 stores a logic "0" data bit. The level of the drain-to-source current is compared with the current through a reference cell to determine the difference between a logic "0" and a logic "1" data bit. Non-selected DRAM cells in the same array as DRAM cell 100 have their gate nodes biased to a negative voltage to minimize leakage currents and disturbances from read and write operations.

One significant disadvantage of conventional 1T/FB DRAM cell 100 is that it requires the use of partially depleted silicon-on-insulator (PD-SOI) process, which is relatively expensive and not widely available. In addition, the floating body effect of the SOI process, although utilized in the 1T/FB DRAM cell advantageously, complicates circuit and logic designs significantly and often requires costly substrate connections to eliminate undesired floating body nodes not located in the 1T/FB DRAM cells. Further, with a PD-SOI process, the device leakage characteristics can be difficult to control due to the lack of effective back-gate control of the bottom interface of the silicon layer that includes silicon regions 107–109.

Conventional 1T/FB DRAM cells are described in more detail in "A Capacitor-less 1T-DRAM Cell," S. Okhonin et al, pp. 85–87, IEEE Electron Device Letters, Vol. 23, No. 2, February 2002, and "Memory Design Using One-Transistor Gain Cell on SOI," T. Ohsawa et al, pp. 152–153, Tech. Digest, 2002 IEEE International Solid-State Circuits Conference, February 2002.

Therefore, one object of the present invention is to provide a 1T/FB DRAM cell that is compatible with a conventional bulk CMOS process, and is compatible with conventional logic processes and conventional logic designs.

It is another object of the present invention to provide a vertical transistor having a gate electrode located at least partially inside a recessed region formed in a shallow-trench isolation (STI) region, wherein the charge storage body region of the vertical transistor is fully isolated.

SUMMARY OF THE INVENTION

Accordingly, the present invention provides a one-transistor, floating-body (1T/FB) dynamic random access memory (DRAM) cell that includes a vertical field-effect transistor fabricated in a semiconductor substrate using a process compatible with a bulk CMOS process.

The 1T/FB DRAM cell of the present invention is fabricated in a semiconductor substrate having an upper surface. A shallow trench isolation (STI) region is located in the semiconductor substrate, wherein the STI region defines a semiconductor island region in the semiconductor substrate. The STI region extends a first depth below the upper surface of the semiconductor substrate. A recessed region located in the STI region exposes a sidewall region of the semiconductor island region. This sidewall region can include one or more sidewalls of the semiconductor island region. The recessed region (and therefore the sidewall region) extends a second depth below the upper surface of the semiconductor substrate, wherein the second depth is less than the first depth (i.e., the recessed region does not extend to the bottom of the STI region).

A gate dielectric layer is located on the sidewall region of the semiconductor island region. A gate electrode is located in the recessed region, and contacts the gate dielectric layer. In one embodiment, a portion of the gate electrode extends over the upper surface of the semiconductor substrate.

A buried source region is located in the semiconductor substrate, wherein the buried source region has a top interface located above the second depth, and a bottom interface located below the first depth. A drain region is located in the semiconductor island region at the upper surface of the semiconductor substrate. A floating body region is located in the semiconductor island region between the drain region and the buried source region. A dielectric spacer can be formed adjacent to the gate electrode and over exposed edges of the gate dielectric layer, thereby preventing undesirable current leakage and shorting.

If the vertical transistor is an NMOS transistor, a logic "1" data bit is written to the 1T/FB DRAM cell using a hot carrier injection mechanism, and a logic "0" data bit is written to the 1T/FB DRAM cell using a junction forward bias mechanism.

The present invention also includes a method of fabricating the 1T/FB DRAM cell. This method includes forming a shallow trench isolation (STI) region having a first depth in a semiconductor substrate, wherein the STI region defines a semiconductor island region in the semiconductor substrate. A buried source region having a first conductivity type is then formed below the upper surface of the semiconductor substrate. The buried source region is formed such that a top interface of the buried source region is located above the first depth, and a bottom interface of the buried source region is located below the first depth. In one embodiment, the buried source region is formed by an ion implantation step.

A recessed region is etched in the STI region adjacent to the semiconductor island region, wherein the recessed region extends a second depth below the upper surface of the substrate. The second depth is less than the first depth (i.e., the recessed region does not extend to the bottom of the STI region). The step of etching the recessed region exposes one or more sidewalls of the semiconductor island region. The top interface of the buried source region is located above the second depth, thereby enabling the formation of a vertical transistor along the sidewalls of the recessed region.

A gate dielectric layer is formed over the sidewalls of the semiconductor island region exposed by the recessed region. A gate electrode is then formed in the recessed region, wherein the gate electrode contacts the gate dielectric layer. A portion of the gate electrode extends over the upper surface of the semiconductor substrate. A drain region of the first conductivity type is formed in the semiconductor island region, wherein the drain region is continuous with the upper surface of the semiconductor substrate. The formation of the buried source region and the drain region result in the formation of a floating body region of the second conductivity type between the drain region and the buried source region in the semiconductor island region. A dielectric spacer can be formed adjacent to the gate electrode, wherein the dielectric spacer extends over an edge of the gate dielectric layer at the upper surface of the semiconductor substrate.

The method can also include forming a well region having the first conductivity type in the semiconductor substrate, wherein the buried source region contacts the well region. Alternately, the method can include forming a deep well region having the first conductivity type in the semiconductor substrate, wherein the deep well region is located below and continuous with the buried source region.

The present invention will be more fully understood in view of the following description and drawings.

DETAILED DESCRIPTION

Figure 2:
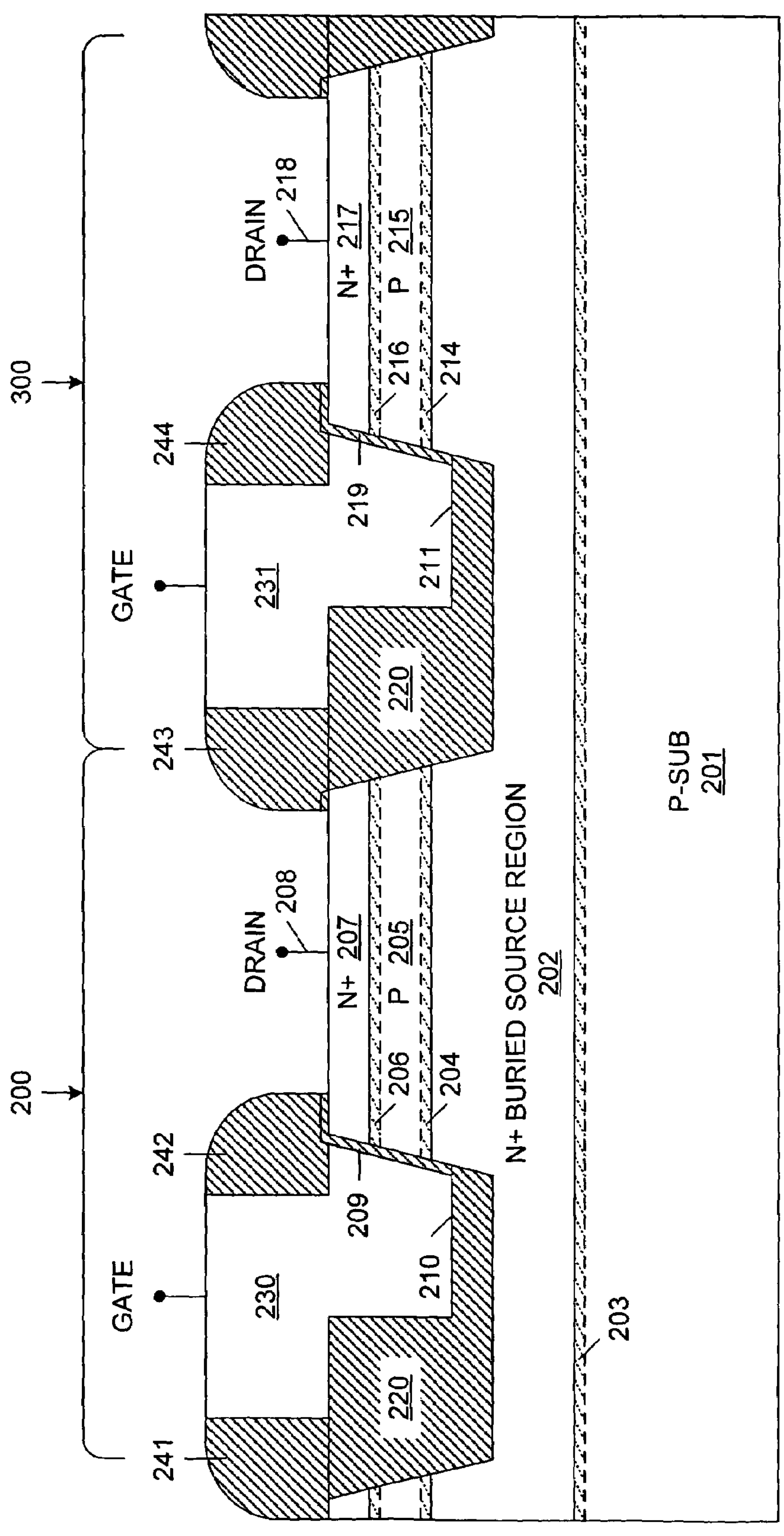
FIG. 2 is a cross-sectional view of two adjacent 1T/FB DRAM cells fabricated using a process compatible with a bulk CMOS process, in accordance with one embodiment of the present invention.

FIG. 2 is a cross-sectional view of two NMOS 1T/FB DRAM cells 200, 300 in accordance with one embodiment of the present invention. Although the present embodiment describes 1T/FB DRAM cells that use NMOS transistors, it is understood that either NMOS or PMOS transistors can be used to form 1T/FB DRAM cells in accordance with the present invention. When a PMOS transistor is used to implement the 1T/FB DRAM cell, the conductivity types of the various elements are reversed.

DRAM cells 200 and 300 share P− type silicon substrate 201, N+ type buried source region 202, depletion region 203 and shallow trench isolation (STI) region 220. As will become more apparent in view of the following description, the illustrated portions of STI region 220 are continuous outside of the cross-section illustrated by FIG. 2.

1T/FB DRAM cell 200 also includes P type floating body region 205, depletion regions 204 and 206, heavily-doped N++ type drain region 207, drain contact 208, gate oxide layer 209, gate electrode 230 and sidewall spacers 241–242. Similarly, 1T/FB DRAM cell 300 includes P type floating body region 215, depletion regions 214 and 216, heavily-doped N++ type drain region 217, drain contact 218, gate oxide layer 219, gate electrode 231 and sidewall spacers 243–244.

Under proper bias conditions, which are described below, floating body region 205 of DRAM cell 200 is completely isolated by STI region 220, gate oxide layer 209 and depletion regions 204 and 206. Similarly, under proper bias conditions, floating body region 215 of DRAM cell 300 is completely isolated by STI region 220, gate oxide layer 219 and depletion regions 214 and 216.

Figure 1:
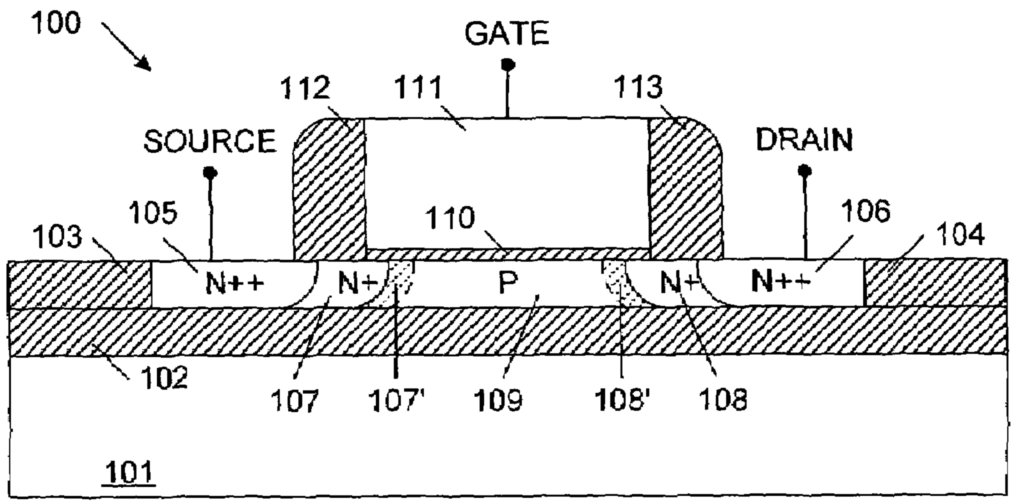
FIG. 1 is a cross-sectional view of a conventional 1T/FB DRAM cell fabricated using a PD-SOI process.
Figure 3:
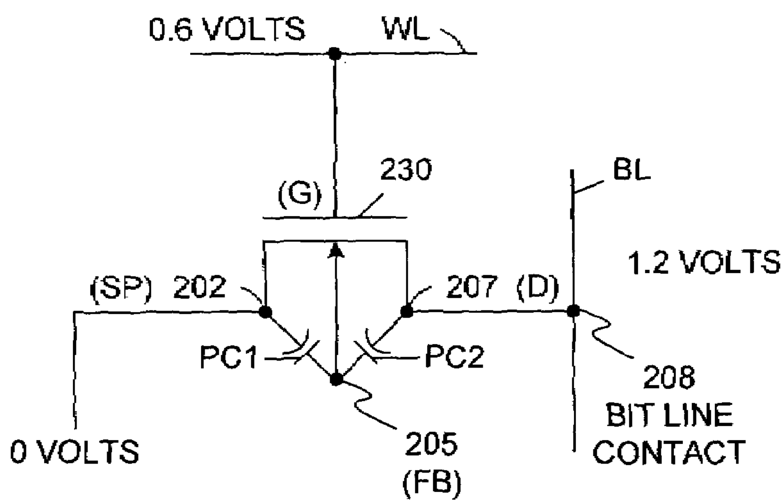
FIG. 3 is a circuit diagram of one of the 1T/FB DRAM cells of FIG. 2.

FIG. 3 is a circuit diagram of the 1T/FB DRAM cell 200. Gate electrode 230 of DRAM cell 200 is connected to a word line WL, drain 207 is connected to a bit line BL and buried source region 202 forms a source plate (SP), that is coupled to a source bias voltage. The p-type floating body region 205 is capacitively coupled to the N+ type buried source region 202 through the parasitic capacitance PC1 of the corresponding PN junction. Similarly, p-type floating body region 205 is capacitively coupled to N++ type drain region 207 through the parasitic capacitance PC2 of the corresponding PN junction.

1T/FB DRAM cell 200 operates as follows (1T/FB DRAM cell 300 operates in the same manner). N+ buried source region 202 is maintained at a ground voltage level (0 Volts). A logic "1" data bit is written into DRAM cell 200 by biasing N+ type drain region 207 at a logic high voltage of about 1.2 Volts, and gate electrode 230 at a mid-level voltage of about 0.6 Volts, thereby inducing hot-carrier injection (HCI). Under these conditions, hot-holes are injected into p-type floating body region 205, thereby raising the voltage level of floating body region 205, and lowering the threshold voltage ($V_T$) of DRAM cell 200.

Conversely, a logic "0" data bit is written into DRAM cell 200 by biasing N+ type drain region 207 to a negative voltage of about −1.0 Volts, while gate electrode 230 is biased at a mid-level voltage of about 0.6 Volts. Under these conditions the PN junction from p-type floating body region 205 to N+ type drain region 207 is forward biased, thereby removing holes from floating body region 205. After a logic "0" data bit has been written, DRAM cell 200 exhibits a relatively high threshold voltage ($V_T$).

A read operation is performed by applying a mid-level voltage of about 0.6 Volts to both drain region 207 and gate electrode 230 (while buried source region 202 remains grounded). Under these conditions, a relatively large drain-to-source current will flow if DRAM cell 200 stores a logic "0" data bit, and a relatively small drain-to source current will flow if DRAM cell 200 stores a logic "1" data bit. The level of the drain-to-source current is compared with the current through a reference cell to determine the difference between a logic "0" and a logic "1" data bit. Non-selected cells in the same array as 1T/FB DRAM cell 200, such as 1T/FB DRAM cell 300, have their gate electrodes biased to a negative voltage to minimize leakage currents and disturbances from read and write operations.

FIGS. 4A–4I are cross sectional views illustrating the manner in which 1T/FB DRAM cells 200 and 300 can be fabricated using a process compatible with a bulk CMOS process.

Figure 4A:
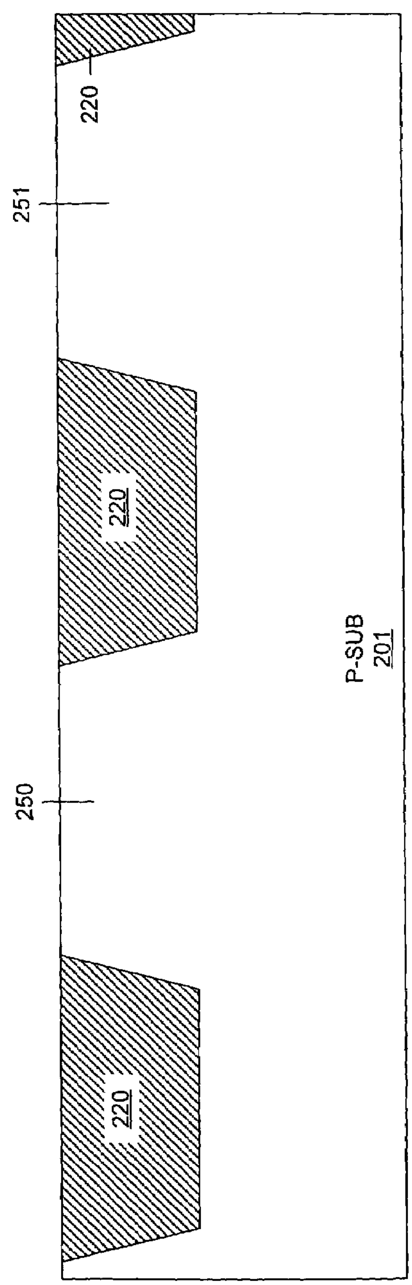
FIGS. 4A–4I are cross sectional views illustrating the manner in which the 1T/FB DRAM cells of FIG. 2 can be fabricated using a process compatible with a bulk CMOS process.

As illustrated in FIG. 4A, a shallow trench isolation region 220 is formed in a p-type monocrystalline silicon substrate 201. Substrate 201 can have various crystal orientations and dopant concentrations in various embodiments of the invention. In addition, the conductivity types of the various regions can be reversed in other embodiments with similar results.

In the described embodiment, STI region 220 is formed using shallow trench isolation (STI) techniques. In STI techniques, trenches are etched in silicon substrate 201, and these trenches are then filled with silicon oxide. The upper surface of the resulting structure is then planarized, such that the upper surfaces of STI region 220 are substantially co-planar with the upper surface of substrate 201. In the described embodiment, STI region 220 has a depth of about 4000 Angstroms. It is understood that this depth is used for purposes of description, and is not intended to limit the invention to this particular depth. As illustrated below (FIG. 6), STI region 220 is joined outside the view of FIG. 4A, thereby forming silicon island region 250, where floating body region 205 and drain region 207 are eventually formed; and silicon island region 251, where floating body region 215 and drain region 217 are eventually formed. In the described embodiment, silicon island regions 250–251 are formed inside p-well regions using conventional CMOS processing steps.

A photoresist mask (not shown) is formed over the upper surface of substrate 201 at locations where 1T/FB DRAM cells are not to be formed. For example, this photoresist mask is formed over locations (not shown) where conventional CMOS transistors are to be formed in substrate 201. Such conventional CMOS transistors can include transistors used for controlling the accessing of the 1T/FB DRAM cells.

Figure 4B:
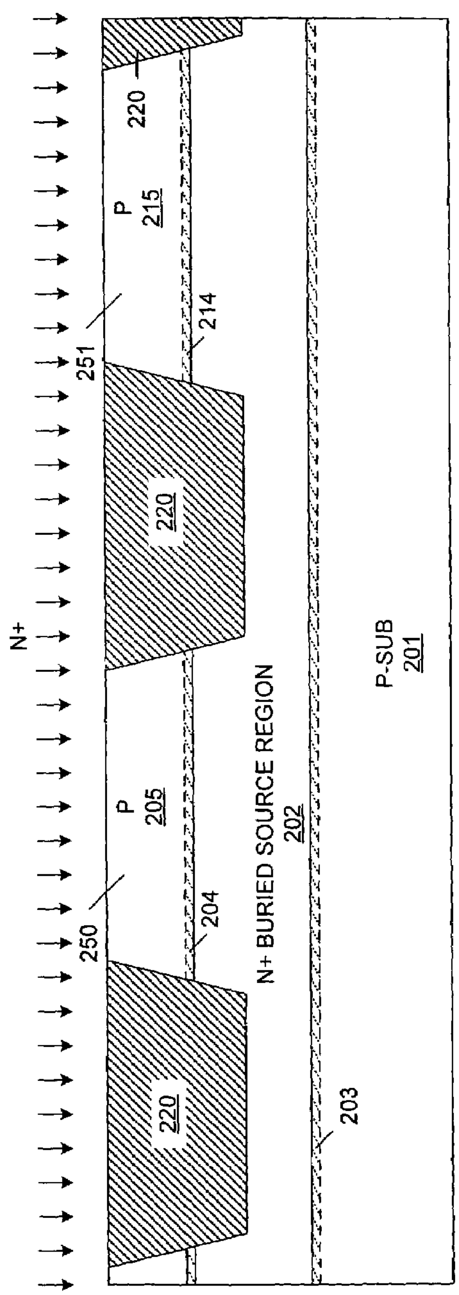

As illustrated in FIG. 4B, a high-energy n-type ion implantation is performed through the photoresist mask into the cell array area to form N+ buried source region 202. In the described example, N+ buried source region 202 extends into an adjacent N-well region (not shown), thereby providing a connection to buried source region 202 at the upper surface of substrate 201. The depth of N+ type buried source region 202 is chosen so that the bottom interface of this region 202 is below the depth of STI region 220, and the top interface of this region 202 is above the depth of STI region 220 and below the depth of the subsequently formed floating body and drain regions. In the described embodiment, the bottom interface of region 202 is located about 6000 to 8000 Angstroms below the upper surface of substrate 201, and the top interface of region 202 is located about 2000 to 3000 Angstroms below the upper surface of substrate 201. Thus, the bottom interface of buried source region 202 is about 2000 to 4000 Angstroms below the depth of STI region 220, and the top interface of buried source region 202 is about 1000 to 2000 Angstroms above the depth of STI region 220.

The formation of N+ type buried source region 202 results in the presence of depletion regions 203, 204 and 214, as illustrated. Various implant materials, energies and dosages can be used to create the above-described N+ buried source region. P-type body regions 205 and 215 are located over N+ buried source region 202, in silicon islands 250 and 251, respectively.

After N+ type buried source region 202 has been implanted, an additional p-type ion implantation step can be performed through the same photoresist mask to adjust the threshold voltage of DRAM cells 200 and 300, without introducing additional process complexity or cost.

Figure 4C:
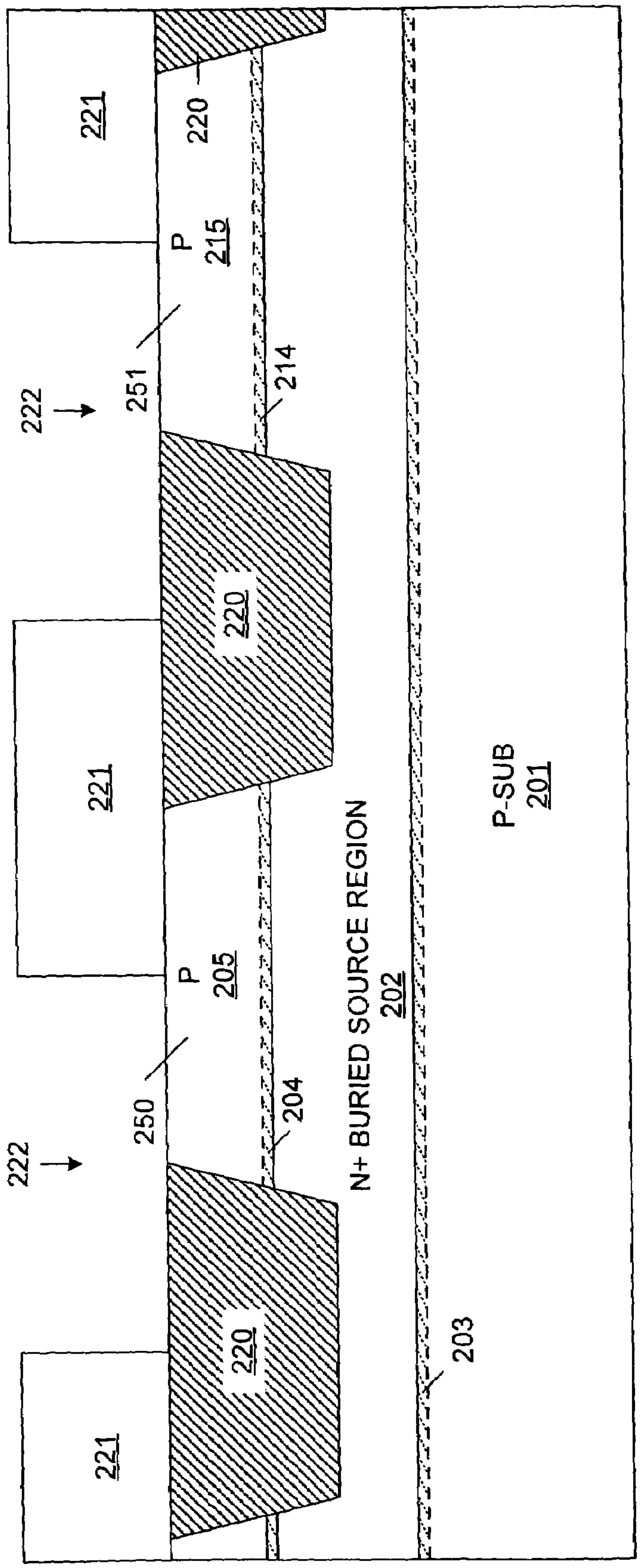

As illustrated in FIG. 4C, the above-described photoresist mask is stripped, and another photoresist mask 221 is formed over the resulting structure. Photoresist mask 221 includes a plurality of openings 222A and 222B, each exposing a portion STI region 220 adjacent to silicon islands 250 and 251.

Figure 4D:
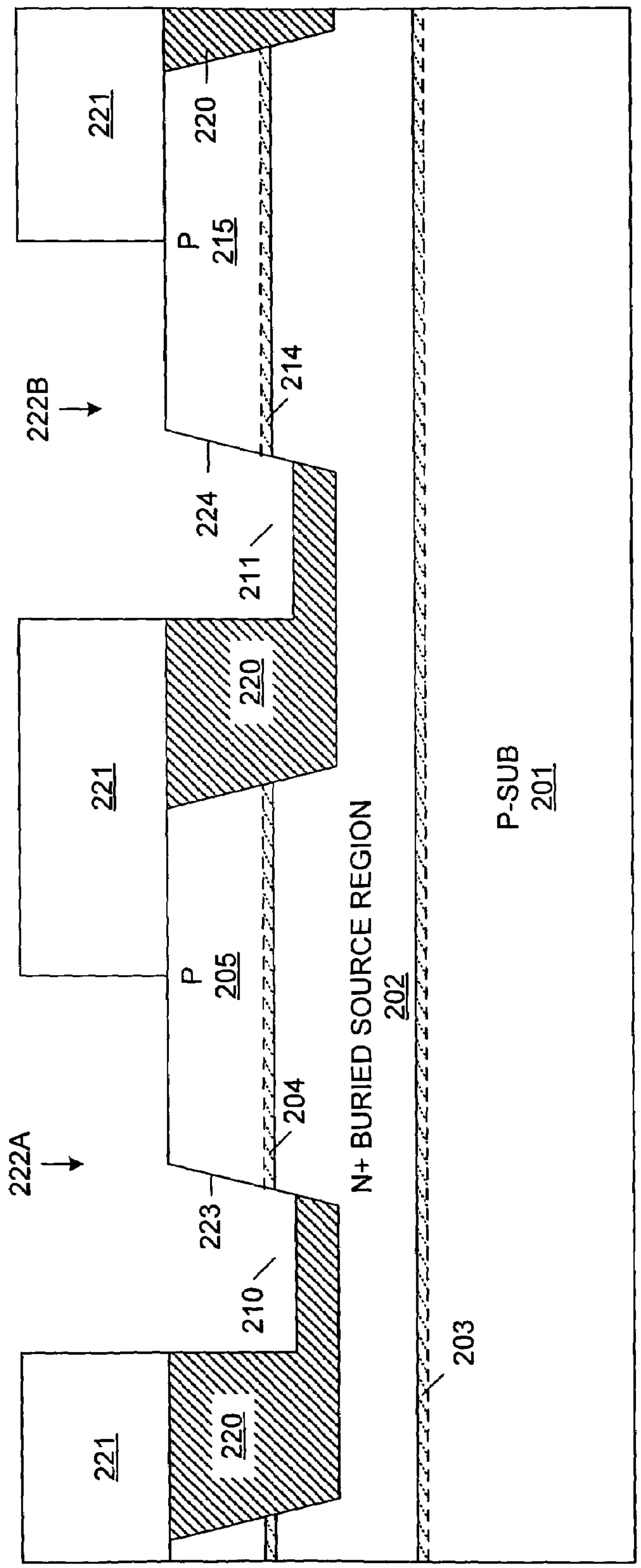

As illustrated in FIG. 4D, an etch step is performed through openings 222A and 222B of photoresist mask 221, thereby forming recessed regions 210 and 211 in STI region 220. Recessed regions 210 and 211 expose sidewall regions 223 and 224 of silicon islands 250 and 251, respectively. The etch step is controlled such that recessed regions 210 and 211 extend below the top interface of buried source region 202, thereby ensuring good vertical transistor formation. In the described embodiment, each of recessed regions 210–211 extends below the top interface of buried source region 202 by about 0 to 1000 Angstroms. The etch step is further controlled such that recessed regions 210 and 211 do not extend to the bottom edges of STI region 220. In the described embodiment, STI region 220 maintains a thickness in the range of 500 to 1500 Angstroms beneath the bottom of recessed regions 210–211.

Figure 4E:
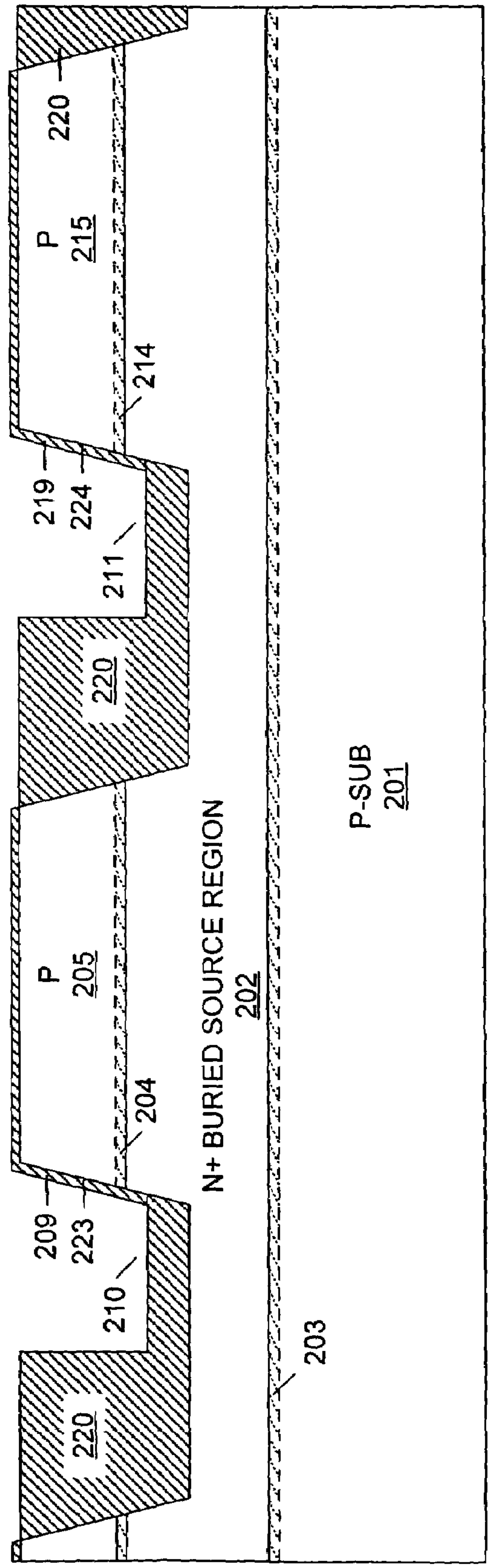

As illustrated in FIG. 4E, photoresist mask 221 is stripped, and a gate dielectric layer is formed over the resulting structure. This gate dielectric layer can be formed by thermal oxidation of the exposed silicon regions, or by depositing a gate dielectric material over the resulting structure. In the described embodiment, the gate dielectric layer includes gate dielectric layers 209 and 219, which have a thickness in the range of about 2 to 4 nm. This thickness can vary depending on the process being used. Gate dielectric layers 209 and 219 are formed over the exposed sidewall regions 223 and 224 and the upper surfaces of silicon islands 205 and 215, respectively.

Figure 4F:
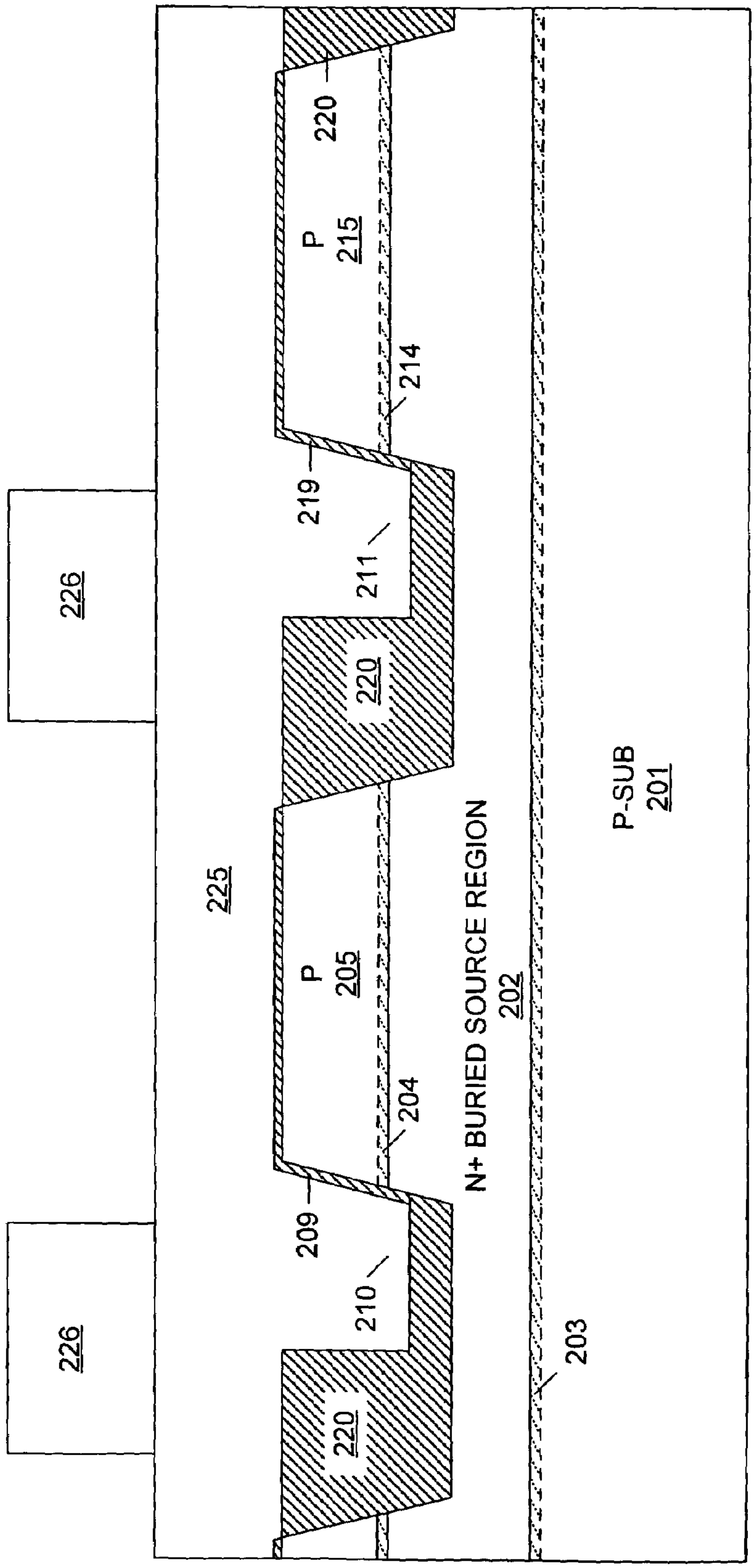

As illustrated in FIG. 4F, a conductive gate electrode layer 225, for example polysilicon, is deposited over the resulting structure. Gate electrode layer 225 extends into recessed regions 210 and 211, as illustrated. As a result, gate electrode layer 225 contacts gate dielectric layers 209 and 219 in recessed regions 210 and 211, respectively. A photoresist mask 226 is formed over gate electrode layer 225 in order to define the locations of the subsequently formed gate electrodes. Photoresist mask 226 extends partially over STI region 220 and partially over recessed regions 210–211, as illustrated in FIG. 4F.

Figure 4G:
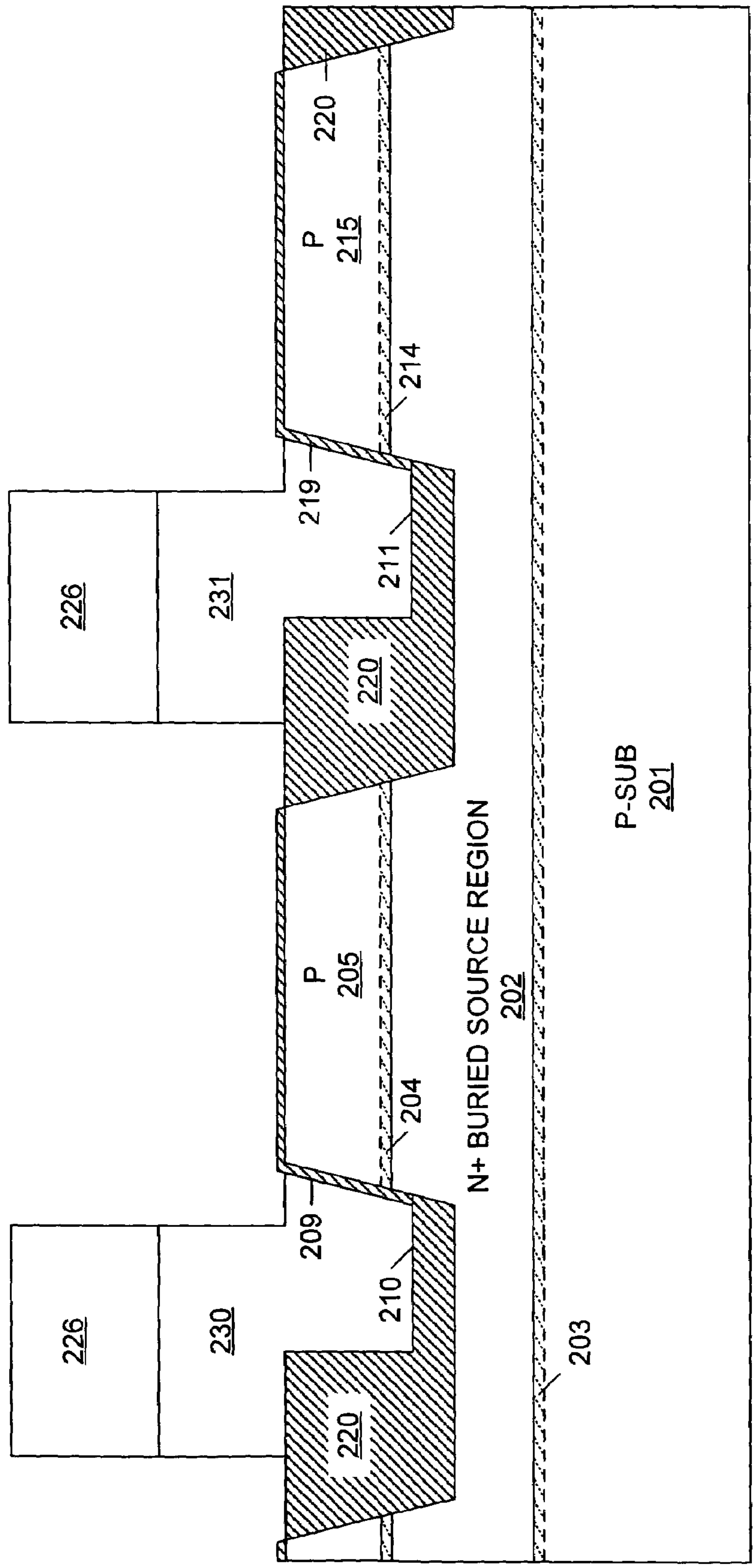

As illustrated in FIG. 4G, an etch is performed through photoresist mask 226, thereby forming gate electrodes 230 and 231. Portions of gate electrodes 230 and 231 extend into recessed regions 210 and 211, respectively, where these gate electrodes 230 and 231 contact gate dielectric layers 209 and 219, respectively. Other portions of gate electrodes 230 and 231 are located above the upper surface of substrate 201.

Figure 4H:
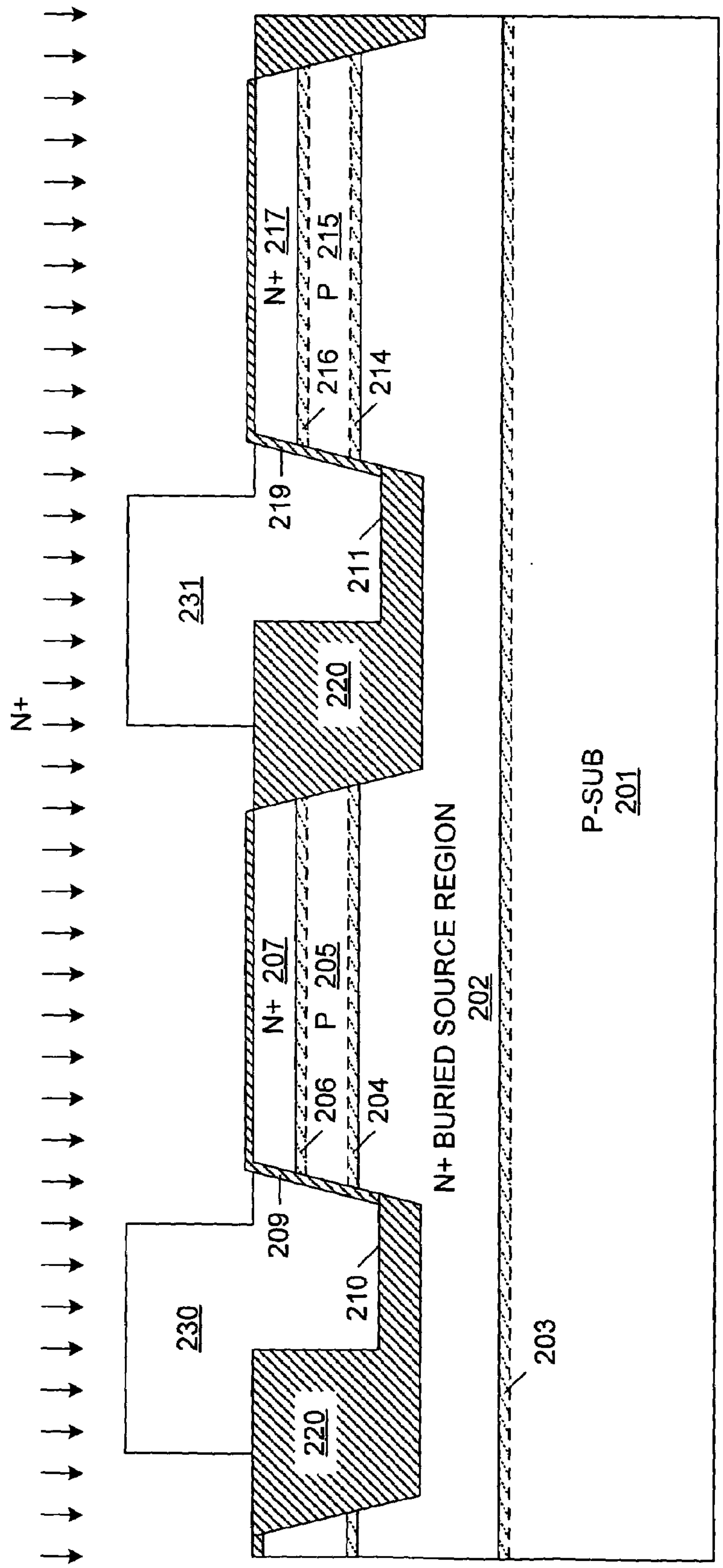

As illustrated in FIG. 4H, an N+ lightly-doped drain (LDD) implant mask (not shown) is then formed to define the locations of the desired N+ LDD regions on the chip. An N+ LDD implant step is performed through this N+ implant mask. The N+ implant step forms N+ LDD regions 207 and 217. Note that N+ LDD regions 207 and 217 result in adjacent depletion regions 206 and 216, respectively.

Figure 4I:
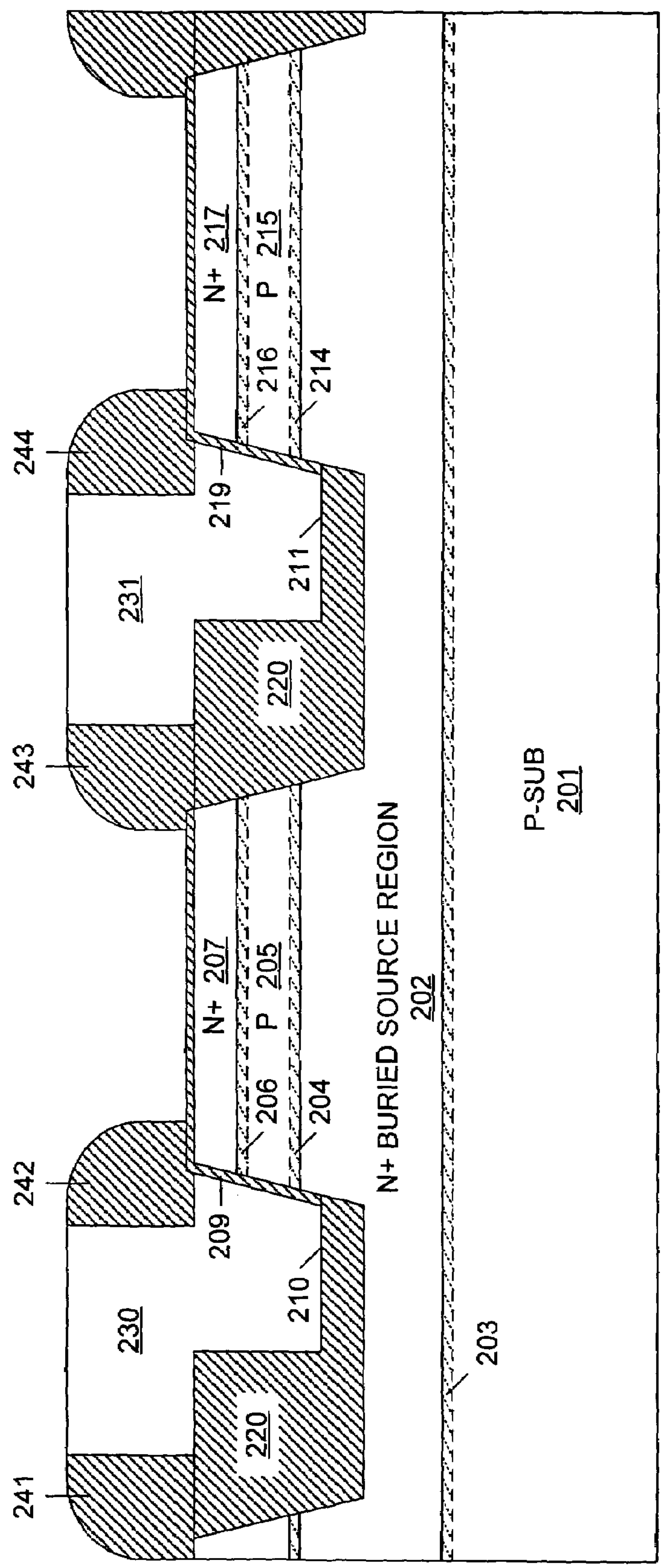

As illustrated in FIG. 4I, dielectric sidewall spacers 241–242 are formed adjacent to gate electrode 230, and dielectric sidewall spacers 243–244 are formed adjacent to gate electrode 231, using conventional processing steps. For example, sidewall spacers 241–244 can be formed by depositing one or more layers of silicon oxide and/or silicon nitride over the resulting structure and then performing an anistotropic etch-back step. The proximity of the raised edges of gate electrodes 230–231 to silicon islands 250–251 of the vertical transistors 200 and 300 is important to ensure that the sidewall spacers 241–244 fully cover the edges of STI region 220 (i.e., the exposed edges of gate dielectric layers 209 and 219) as shown in FIG. 4I, thereby preventing any damages of shorting defects to the gate dielectric layers 209 and 219 at the upper surface of the STI boundary.

P-type floating body regions 205 and 215 remain between buried source region 202 and N+ LDD regions 207 and 217, respectively (FIG. 4I).

After sidewall spacers 241–244 have been formed, an N++ implant can be performed through an N++ implant mask, thereby forming N++ drain regions in a self-aligned manner with dielectric spacers 241–244.

Figure 5:
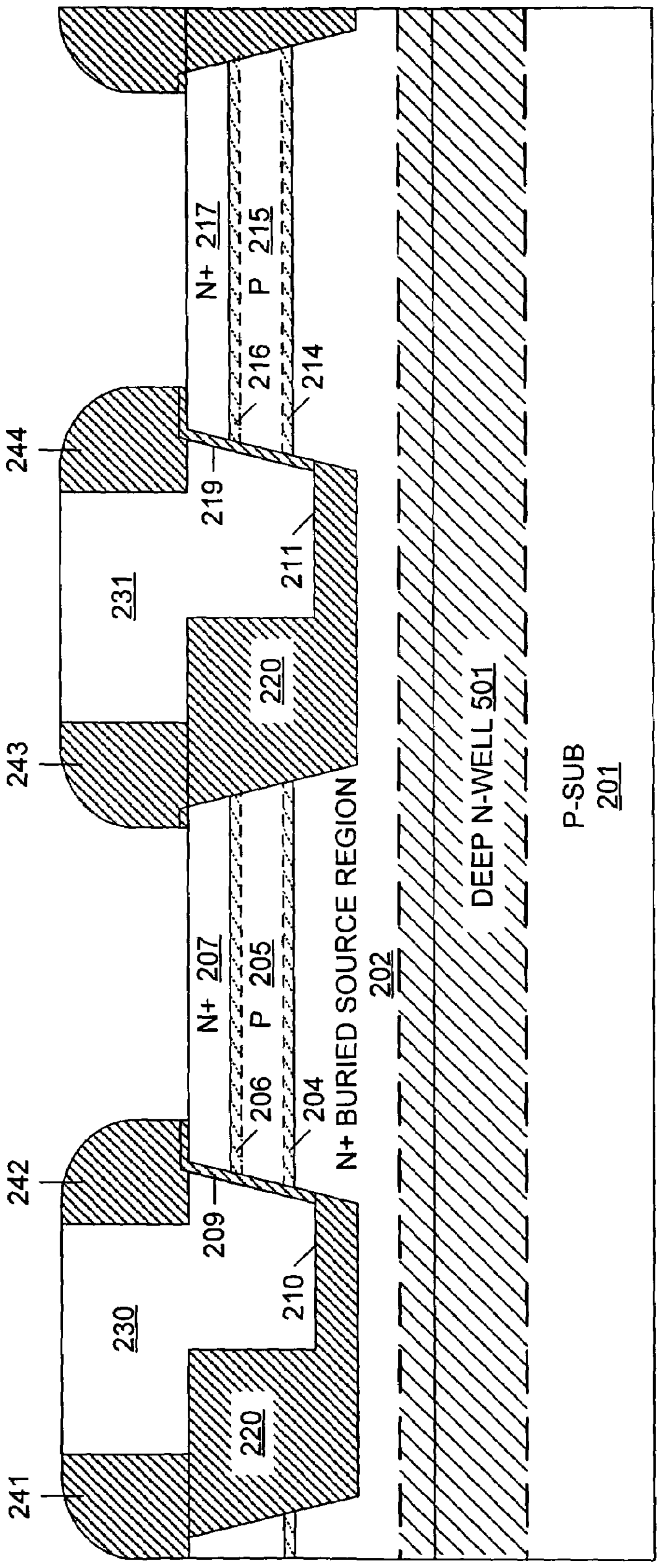
FIG. 5 is a cross-sectional view of two 1T/FB DRAM cells fabricated using a process compatible with a triple-well CMOS process, in accordance with another embodiment of the present invention.

In an alternate embodiment, 1T/FB DRAM cell 200 can be fabricated using a process compatible with a conventional triple-well CMOS process. FIG. 5 illustrates a triple-well embodiment, wherein similar elements in FIGS. 4I and 5 are labeled with similar reference numbers. FIG. 5 shows a deep N-well region 501, which is formed beneath buried source region 202. DRAM cells 200 and 300 are formed inside the P-well above the deep N-well region 501. Buried source region 202 is formed so that the bottom interface of this region 202 is in contact with deep N-well region 501, and the top interface of region 202 is above the depth of STI region 220. Deep N-well region 501 extends into an adjacent N-well region (not shown), thereby providing a connection to deep N-well region 501 (and thereby to buried source region 202) at the upper surface of substrate 201.

Figure 6:
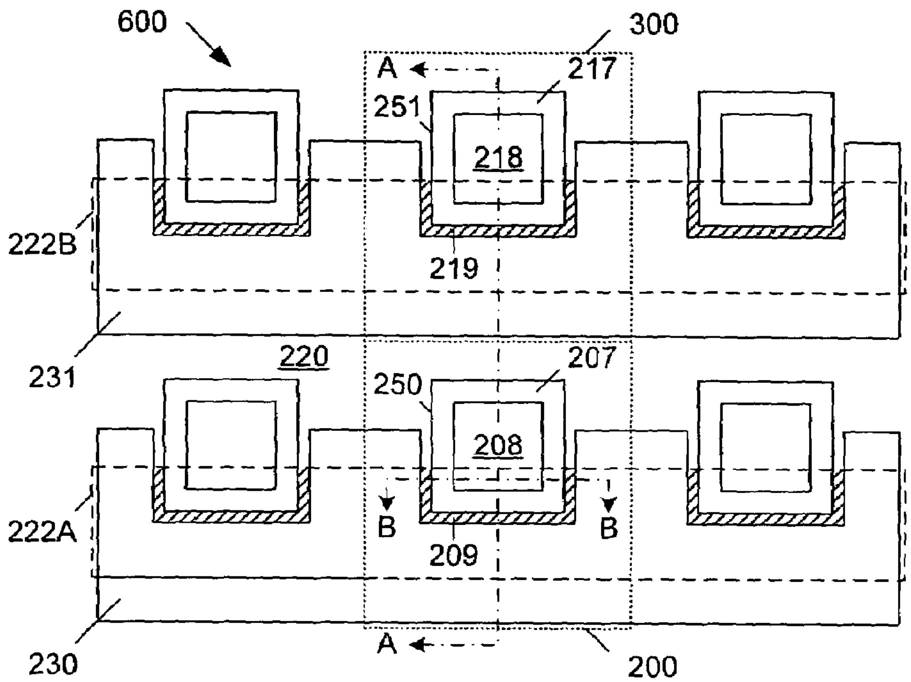
FIG. 6 is a layout diagram of a repeatable array of 1T/FB DRAM cells, including the 1T/FB DRAM cells of FIG. 2, in accordance with one embodiment of the present invention.
Figure 7:
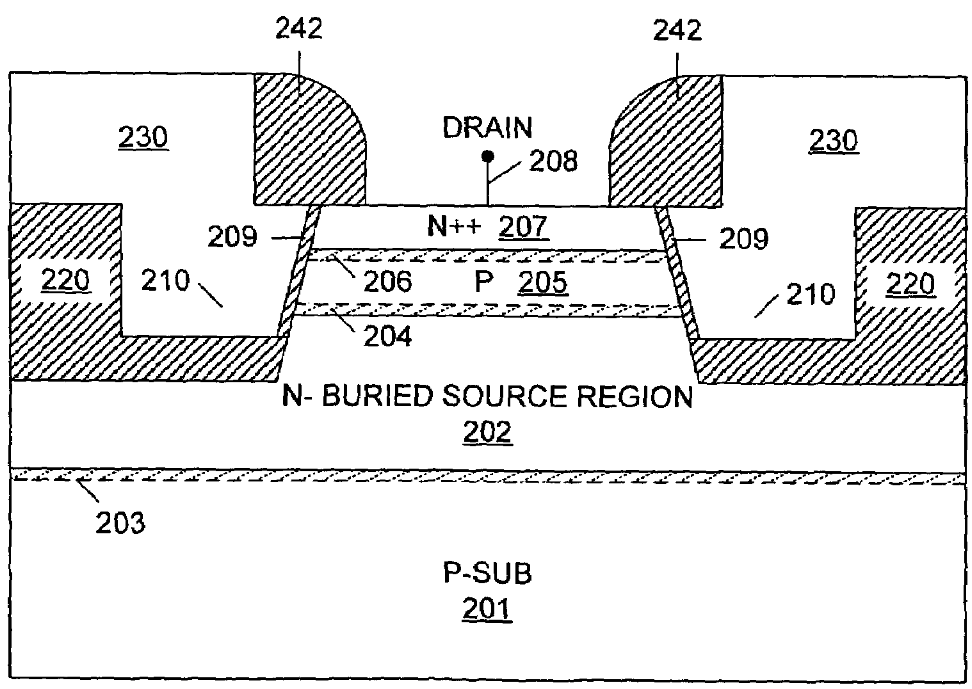
FIG. 7 is a cross-sectional view of a 1T/FB DRAM cell along section line B—B of FIG. 6.

FIG. 6 is a layout diagram of a repeatable array 600 of 1T/FB DRAM cells, including 1T/FB DRAM cells 200 and 300. FIG. 2 is a cross-sectional view of DRAM cells 200 and 300 along section line A—A of FIG. 6. FIG. 7 is a cross-sectional view of DRAM cell 200 along section line B—B of FIG. 6. Similar elements in FIGS. 2, 6, and 7 are labeled with similar reference numbers. For example, the reference numbers 230 and 231 are is used to identify gate electrodes in FIGS. 2, 6 and 7. Note that dielectric sidewall spacers are not illustrated in FIG. 6 for clarity. Although recessed regions 210–211 are not explicitly labeled in FIG. 6, the openings 222A–222B of the mask 221 (FIG. 4D) used to form recessed regions 210–211 are illustrated in FIG. 6. As described above in connection with FIG. 4D, recessed regions are formed within openings 222A–222B, except where these openings 222A–222B expose the underlying silicon island regions.

Although the invention has been described in connection with several embodiments, it is understood that this invention is not limited to the embodiments disclosed, but is capable of various modifications, which would be apparent to a person skilled in the art. Thus, the invention is limited only by the following claims.

I claim:

1. A method of fabricating a one-transistor, floating-body (1T/FB) dynamic random access memory (DRAM) cell, method comprising:

forming a shallow trench isolation (STI) region in a semiconductor substrate, wherein the STI region defines a semiconductor island region in the semiconductor substrate, and wherein the STI region extends a first depth below an upper surface of the semiconductor substrate;

forming a buried source region having a first conductivity type below the upper surface of the semiconductor substrate, the buried source region having a top interface located below the upper surface of the semiconductor substrate and above the first depth, and a bottom interface located below the first depth; and etching a recessed region in the STI region adjacent to the semiconductor island region, wherein the recessed region extends a second depth below the upper surface of the substrate, the second depth being less than the first depth, and the top interface of the source region being located above the second depth.

2. The method of claim 1, wherein the buried source region is formed by an ion implantation step.

3. The method of claim 1, further comprising performing a threshold voltage adjustment implant having a second conductivity type, opposite the first conductivity type, into the semiconductor island region.

4. The method of claim 1, wherein the step of etching the recessed region exposes one or more sidewalls of the semiconductor island region.

5. The method of claim 4, further comprising forming a gate dielectric layer over the one or more exposed sidewalls of the semiconductor island region.

6. The method of claim 4, further comprising forming a gate electrode in the recessed region over the gate dielectric layer.

7. The method of claim 6, further comprising forming a drain region of the first conductivity type in the semiconductor island region, wherein the drain region is continuous with the upper surface of the semiconductor substrate.

8. The method of claim 7, wherein a floating body region of the second conductivity type is formed between the drain region and the buried source region in the semiconductor island region.

9. The method of claim 7, wherein a first portion of the gate electrode is located over the upper surface of the semiconductor substrate, the method further comprising forming a dielectric spacer adjacent to the first portion of the gate electrode, wherein the dielectric spacer extends over a portion of the gate dielectric layer at the upper surface of the semiconductor substrate.

10. The method of claim 1, wherein the 1T/FB DRAM cell is fabricated using a process compatible with a standard CMOS process.

11. The method of claim 1, further comprising forming a well region having the first conductivity type in the semiconductor substrate, wherein the buried source region contacts the well region.

12. The method of claim 1, further comprising forming a deep well region having the first conductivity type in the semiconductor substrate, wherein the deep well region is located below and continuous with the buried source region.

13. The method of claim 12, further comprising forming a well region having the first conductivity type in the semiconductor substrate, wherein the well region contacts the deep well region.

* * * * *